(12) United States Patent
Shimoda et al.

(10) Patent No.: US 6,592,729 B2
(45) Date of Patent: Jul. 15, 2003

(54) IN-LINE SPUTTERING APPARATUS

(75) Inventors: Kazunori Shimoda, Nagaokakyo (JP); Eiichi Takata, Nagaokakyo (JP); Michio Kadota, Kyoto (JP); Ken Funato, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 10 days.

(21) Appl. No.: 09/931,839

(22) Filed: Aug. 17, 2001

(65) Prior Publication Data
US 2002/0046946 A1 Apr. 25, 2002

(30) Foreign Application Priority Data

Aug. 18, 2000 (JP) ........................................ 2000-248719

(51) Int. Cl.[7] ............................................... C23C 14/34
(52) U.S. Cl. ........................... 204/298.11; 204/298.07; 204/298.14; 204/298.15; 204/298.25
(58) Field of Search ........................ 204/298.07, 298.11, 204/298.14, 298.15, 298.25

(56) References Cited

U.S. PATENT DOCUMENTS

| 4,102,768 A | * | 7/1978 | Kearin et al. | .......... 204/298.11 |
| 4,562,093 A | * | 12/1985 | Mario et al. | ........... 204/298.11 |
| 4,849,087 A | * | 7/1989 | Meyer | ................... 204/298.07 |
| 6,309,525 B2 | * | 10/2001 | Futagawa et al. | ...... 204/298.11 |

FOREIGN PATENT DOCUMENTS

| JP | 62-162255 | 10/1987 |
| JP | 9-12540 | 5/1997 |
| JP | 09-125240 | * 5/1997 |

* cited by examiner

Primary Examiner—Rodney G. McDonald
(74) Attorney, Agent, or Firm—Keating & Bennett, LLP

(57) ABSTRACT

An in-line sputtering apparatus includes a deposition chamber, a target installed inside the deposition chamber, a substrate holder to hold a substrate, a substrate holder transferring mechanism which transfers the substrate holder relative to the target such that a thin film made of a material of the target that is formed on the substrate held by the substrate holder, first and second thickness distribution correcting members and a plate driving mechanism. The first and second thickness distribution correcting members are provided above the target, and each of the first and second thickness distribution correcting members has a plurality of movable plates. The plate driving mechanism is linked to the first and second thickness distribution correcting members and moves the corresponding movable plates of the first and second distribution correcting plates, symmetrically.

22 Claims, 14 Drawing Sheets

IN-LINE SPUTTERING APPARATUS

BACKGROUND OF THE INVENTION

1. Field of the Invention

The present invention relates to sputtering apparatuses used for forming metal thin films, piezoelectric thin films, dielectric thin films, and other thin films, and more specifically, the present invention relates to an in-line sputtering apparatus in which a thin film is formed while a substrate is being transferred in front of a plurality of targets.

2. Description of the Related Art

Conventionally, various kinds of sputtering apparatuses for forming various kinds of thin films such as metal thin films and piezoelectric thin films, have been proposed. Generally, the thicknesses of thin films formed by sputtering apparatuses must be uniform.

In Japanese Unexamined Patent Application Publication No. 9-125240, an example of a sputtering apparatus that controls the thickness of a thin film is disclosed. FIG. 11 is a schematic diagram of a sputtering apparatus disclosed in the JP 9-125240, and FIG. 12 is a schematic plan view for explaining a thickness distribution correcting member.

As shown in FIG. 11, a sputtering apparatus 101 includes a deposition chamber 102, in which a substrate holder 103 is disposed. A substrate 104 is fixed on a surface of the substrate holder 103.

A target 105 is arranged such that the target 105 opposes the substrate 104, and a thickness distribution correcting member 106 is disposed above the target 105.

As shown in FIG. 12 by a plan view, the thickness distribution correcting member 106 includes a pair of supporting plates 106a and 106b which are fixedly disposed. The supporting plates 106a and 106b are arranged such that the supporting plates 106a and 106b oppose each other with the target 105 disposed therebetween and extend parallel to each other. In addition, the supporting plates 106a and 106b are linked with a plurality of correcting plates 106c and 106d, respectively. The correcting plates 106c and 106d are constructed to be movable in the direction shown by the arrow in the figure.

As shown in FIG. 11, in the sputtering apparatus 101, target particles 105a are sputtered away from the target by ions A, move toward the substrate 104, and are deposited on the exposed surface of the substrate 104. Accordingly, a thin film is formed. In this case, thickness uniformity of the thin film formed on the substrate 104 depends on the flatness, attachment angles, and other characteristics of the substrate 104 and the target 105. As a result, the thickness of the thin film may not be uniform. Thus, in order to ensure thickness uniformity of the thin film, the thickness distribution correcting member 106 is used in the sputtering apparatus 101. In the thickness distribution correcting member 106, the size of the opening B surrounded by the inner ends of the correcting plates 106c attached to the supporting plate 106a and the inner ends of the correcting plates 106d attached to the supporting plate 106b is adjusted so that the thickness distribution of the thin film can be corrected. More specifically, when some of the correcting plates 106c and 106d are moved to reduce the gaps therebetween, the movement of the target particles 105a toward the substrate 104 is impeded, and the thickness of the corresponding portion of the thin film is reduced.

In the sputtering apparatus 101, when positions of the correcting plates 106c and 106d of the thickness distribution correcting member 106 are to be adjusted, the deposition chamber 102 is first vented to the atmosphere. Then, correcting plates 106c and 106d are moved and are fixed at desired positions, such that the gaps therebetween are adjusted, and the pressure in the deposition chamber 102 is reduced again.

On the other hand, an in-line sputtering apparatus including a thickness controlling plate is disclosed in Japanese Unexamined Utility Model Application Publication No. 62-162255. As shown in FIG. 13, according to JP 62-162255, a sputtering apparatus 111 includes a deposition chamber 112, in which a substrate holder 113 is disposed. A substrate 114 is fixed on the substrate holder 113. Targets 116 are disposed on an inwardly facing surface of a covering member 115, which is provided for covering the deposition chamber 112. The substrate 114 is moved along with the substrate holder 113 in the direction shown by the arrow C in the figure, so that, while the substrate 114 is being transferred in front of the targets 116, target particles continuously accumulate on the substrate 114 to form a thin film.

The sputtering apparatus 111 is provided with a thickness controlling member 117, which is schematically shown in FIG. 13. The actual shape of the thickness controlling member 117 as seen from the front is shown in FIG. 14. The thickness controlling member 117 includes a supporting plate 118 having a rectangular shape which is provided with a rectangular opening. Correcting plates 119 and 120 constructed of metal are fixed to the supporting plate 118 at two sides thereof so as to oppose each other in the lateral direction. Inner edges 119a and 120a of the correcting plates 119 and 120 oppose each other, and the shapes thereof are determined in accordance with the correction of the thickness distribution of the thin film. The shapes of the inner edges 119a and 120a of the correcting plates 119 and 120, respectively, are adjusted by cutting metal plates, and vary along the vertical direction as shown in the figure. When the substrate 114 is transferred in the direction shown by the arrow C (FIG. 13), the movement of the target particles knocked away from the target 116 is impeded by the correcting plates 119 and 120. Accordingly, the thickness distribution is corrected such that the thickness of the thin film is reduced at portions where the gap between the inward edges 119a and 120a is narrow, and is increased at portions where the gap therebetween is wide.

As described above, according to the sputtering apparatus shown in FIGS. 11 and 12, which is disclosed in Japanese Unexamined Patent Application Publication No. 9-125240, the thickness distribution is corrected by adjusting the widths of the gaps between the correcting plates 106c and 106d. However, there is a problem in that the relationship between the change of the sizes of the gaps and the change of the thickness distribution of the thin film formed is not reliable, and it is difficult to control the thickness distribution of the thin film with high accuracy.

In a sputtering process, an erosion region of the target is sputtered, and target particles are knocked away from the target and accumulated on a substrate so that a thin film is formed. The thickness of the thin film formed on the substrate varies depending on the coverage of the erosion region of the target by the correcting plates 106c and 106d. In the above-described conventional technique, although the gaps between the correcting plates 106c and 106d are adjusted, the coverage of the erosion region of the target is not determined.

Thus, as schematically shown in FIGS. 15A and 15B, the correcting plates 106c and 106d cover the erosion region of the target 105 asymmetrically. Accordingly, although the thickness of the thin film may be reduced by reducing the gaps between the correcting plates 106c and 106d, a reliable relationship between the displacements of the correcting plates 106c and 106d and the thickness variation of the thin film cannot be obtained. Thus, in order to make the thickness uniform, processes of adjusting the positions of the correcting plates 106c and 106d and measuring the thickness distribution of the formed thin film must be performed several times.

Thus, in the method according to the above-described conventional technique, only the gaps between the correcting plates 106c and 106d are adjusted, and the correcting plates 106c and 106d are not moved symmetrically about the center of the target 105 and the substrate 104.

In addition, in the method according to the above-described conventional technique, the deposition chamber 102 must be vented to the atmosphere when the positions of the correcting plates 106c and 106d are to be adjusted after having been already set. Thus, a significant amount of time is required to adjust the thickness of the thin film in the deposition process.

On the other hand, in the sputtering apparatus disclosed in Japanese Unexamined Patent Application Publication No. 62-162255, the shapes of the inner edges 119a and 120a of the correcting plates 119 and 120 are determined in accordance with targets and substrates. Thus, if the deposition process is performed and the target is changed after the correcting plates 119 and 120 are cut and the shapes of the inner edges 119a and 120a are determined, the inner edges 119a and 120a of the correcting plates 119 and 120 must be reprocessed in accordance with the new target. Since the correcting plates 119 and 120 must be reprocessed, a significant amount of time is required for correcting the thickness distribution, and high costs are incurred.

In addition, in the sputtering apparatus 111, the substrate 114 is transferred in front of the target 116. However, the substrate holder 113 may be inclined in the transfer direction (horizontal direction) or in the vertical direction. Thus, even when the thickness distribution is corrected by using the thickness controlling member 117, the distance between the substrate 114 and the target 116 is not always constant in the vertical or in the above-described transfer direction. Accordingly, even when the thickness is controlled by the thickness controlling member 117, it is difficult to form thin films having a uniform thickness with high reproducibility.

SUMMARY OF THE INVENTION

In order to overcome the problems described above, preferred embodiments of the present invention provide an inline sputtering apparatus which makes the adjusting operation for the thickness control simpler and reduces the time required therefor, and forms a thin film having a uniform thickness reliably and easily.

According to a preferred embodiment of the present invention, an in-line sputtering apparatus includes a deposition chamber, a target installed inside the deposition chamber, a substrate holder to hold a substrate, a substrate holder transferring mechanism which transfer the substrate holder relative to the target such that a thin film including a material of the target is formed on the substrate held by the substrate holder, first and second thickness distribution correcting members and the plate driving mechanism. The first and second thickness distribution correcting members are provided above the target, and each of the first and second thickness distribution correcting members has a plurality of moveable plates. The plate driving mechanism is linked to the first and second thickness distribution correcting members and symmetrically moves the corresponding moveable plates of the first and second distribution correcting plates.

The plate driving mechanism may include a control unit which is disposed outside of the deposition chamber, and a link mechanism of which one end is linked to the control unit and the other end is linked to the first and the second thickness distribution correcting members.

The substrate holder transferring mechanism may include a guide rail that is disposed in the deposition chamber and extends along the transfer direction of the substrate and along which the substrate holder is constructed to be moveable, and a driving mechanism for driving the substrate holder.

The in-line sputtering apparatus may further include an ambient gas injection pipe for injecting an ambient gas into the deposition chamber. The ambient gas injection pipe preferably includes nozzles to eject the ambient gas toward the centers of the target.

In the in-line sputtering apparatus according to various preferred embodiments of the present invention, each of the first and the second thickness distribution correcting members preferably includes a plurality of moveable plates. The moveable plates of the first and the second thickness distribution correcting members are moved in pairs symmetrically by the plate driving mechanism. Since the moveable plates are moved in pairs symmetrically, the relationship between the displacements of the moveable plates of the thickness distribution correcting members and the change of the thickness distribution is reliably obtained, and the thickness distribution is controlled with high accuracy.

Accordingly, in the in-line sputtering apparatus in which a thin film is formed on a substrate while the substrate is being transferred in front of a plurality of targets, a thin film having a uniform thickness is reliably formed, even when regional differences in thickness thereof are caused at each of the targets, by correcting the thickness distribution with the use of the first and the second thickness distribution correcting members and the plate driving mechanism.

The plate driving mechanism may include a control unit which is disposed outside of the deposition chamber and a link mechanism of which one end is linked to the control unit and the other end is linked to the first and the second thickness distribution correcting members. In such a case, the thickness distribution control using the first and the second thickness distribution correcting members is easily performed by operating the control unit which is disposed outside of the deposition chamber. Accordingly, it is not necessary to vent the deposition chamber to the atmosphere, and the operation of adjusting the thickness distribution is performed more easily.

When a guide rail is provided in the deposition chamber and a substrate holder is constructed to be moveable along the guide rail, the substrate held by the substrate holder is more reliably transferred in the transfer direction. Accordingly, differences in thicknesses between thin films formed on substrates held by different substrate holders are eliminated.

In addition, when nozzles of ambient gas injection pipes are disposed such that ambient gas is ejected toward the centers of the targets, the gas uniformly flows over the targets. Accordingly, the thickness distribution is accurately adjusted by the thickness distribution correcting members with high reproducibility.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWINGS

FIGS. 3A and 3B are schematic diagrams showing the relationship of a target and first and second thickness distribution correcting members according to a preferred embodiment of the present invention, wherein FIG. 3A is a schematic diagram of a portion of the sputtering apparatus shown in FIG. 1 as seen from a direction shown by the arrow X and FIG. 3B is a sectional view of FIG. 3A which is cut along line Y—Y.

DETAILED DESCRIPTION OF PREFERRED EMBODIMENTS

Hereinafter, preferred embodiments of the present invention are explained in detail with reference to the drawings.

The present invention will be further illustrated by describing an in-line sputtering apparatus according to preferred embodiments of the present invention with reference to the attached drawings. Although the in-line sputtering apparatus of preferred embodiments described below is provided with a plurality of targets, the present invention may also be applied to in-line sputtering apparatuses having only one target.

Figure 1A:
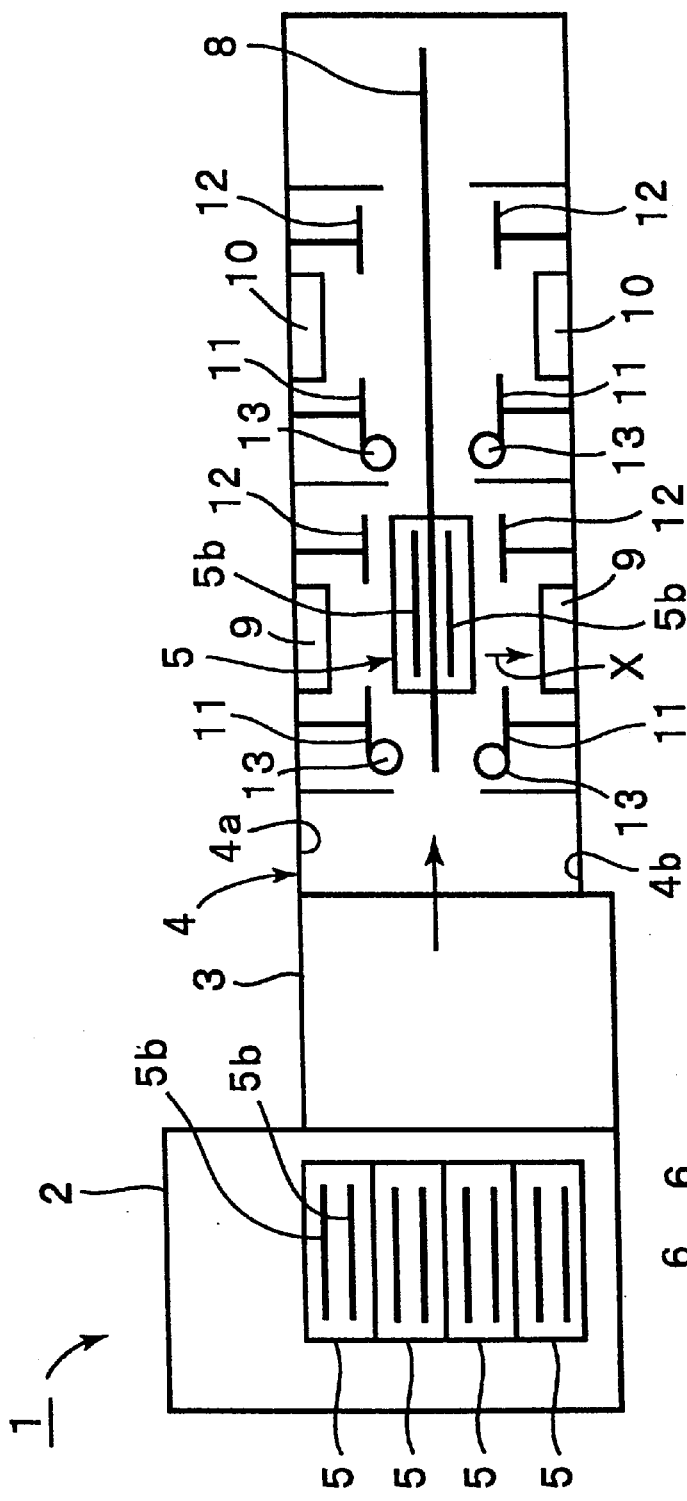
FIG. 1A is a schematic plan view of a sputtering apparatus according to a preferred embodiment of the present invention.

FIG. 1A is a schematic plan view for explaining a construction of an in-line sputtering apparatus according to a preferred embodiment of the present invention. A sputtering apparatus 1 preferably includes a preparation chamber 2, a load lock chamber 3, and a deposition chamber 4. A plurality of carriers 5 are preferably disposed in the preparation chamber 2.

Figure 1B:
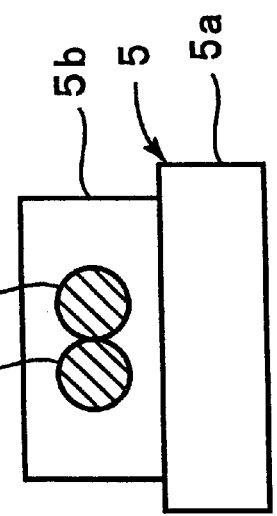
FIG. 1B is a schematic representation of a carrier which shows a manner in which substrates are fixed on a substrate holder.
Figure 2:
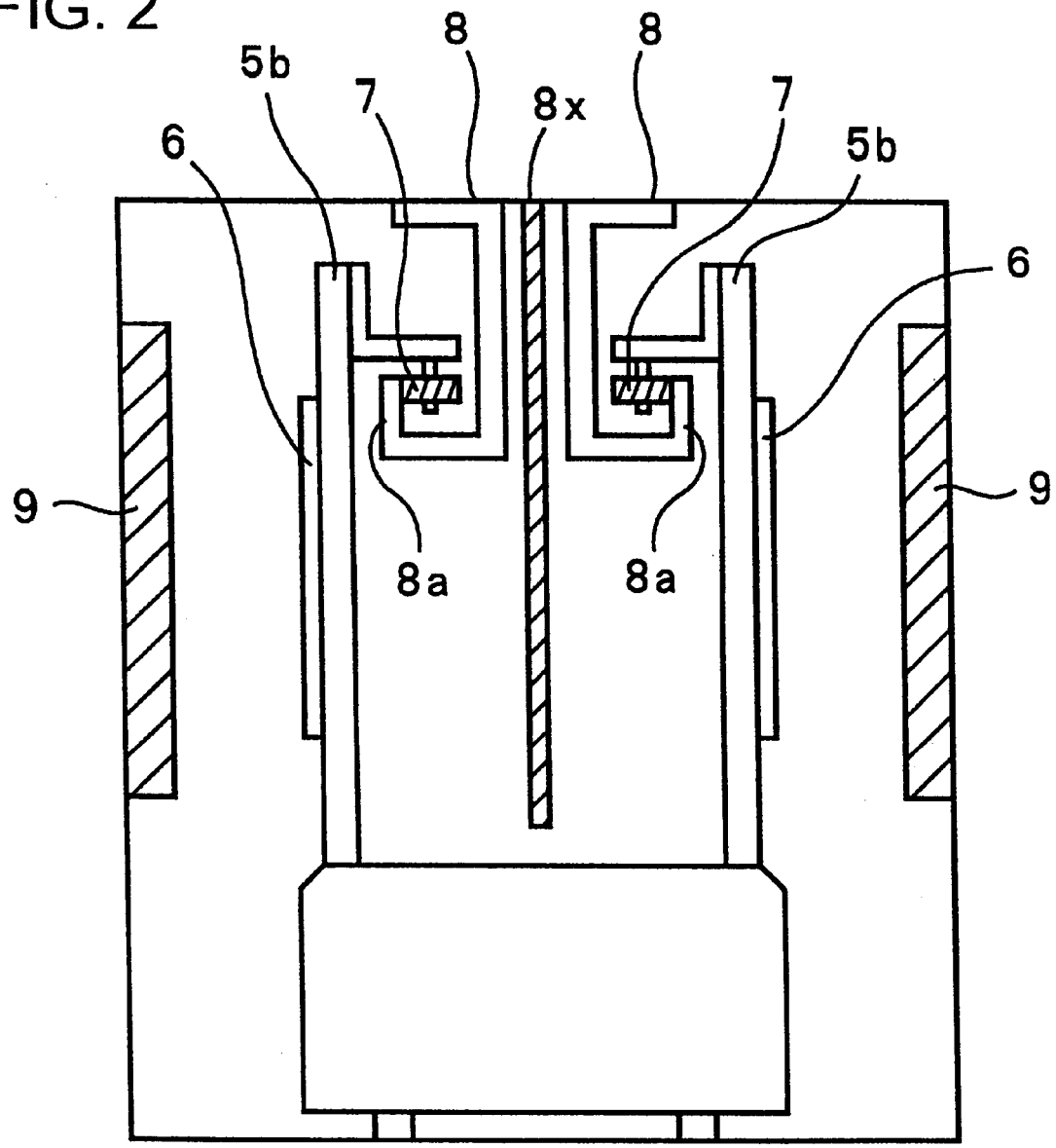
FIG. 2 is a schematic cross-sectional view of the sputtering apparatus shown in FIG. 1, which is cut along line A—A.

As shown in FIG. 1B, each of the carriers 5 preferably includes a base 5a and substrate holders 5b, which extend upwardly from the base 5a. As shown in FIG. 2, which will be described below, substrate holders 5b are arranged as pairs, and substrates 6 are individually fixed on the substrate holders 5b at the outwardly facing surfaces thereof. In the present preferred embodiment, thin films are formed on the exposed surfaces of the substrates 6, which are individually fixed to the substrate holders 5b, preferably by sputtering.

The carriers 5 are transferred from the preparation chamber 2 to the load lock chamber 3, and are then transferred from the load lock chamber 3 to the deposition chamber 4. The carriers 5 including the substrate holders 5b are transferred by a driving unit such as a motor or other suitable driving mechanism which is not shown in the figure.

FIG. 2 is a cross-sectional view of the deposition chamber 4. Each of the carriers 5 preferably includes a pair of substrate holders 5b as described above, and rotatable pulleys 7 are individually linked with the substrate holders 5b at the inwardly facing sides thereof. In addition, the deposition chamber 4 is provided with guide rails 8 which extend in a transfer direction. Although a detailed construction is not shown in FIG. 1, a pair of guide rails 8 extend downwardly from the ceiling of the deposition chamber 4 as shown in FIG. 2, and a partition plate 8x is provided between the guide rails 8. The end portions of the guide rails 8 are bent toward the substrate holders 5b such that upright wall portions 8a are formed at the outward ends of the bent portions. The wall portions 8a are arranged such that the inwardly facing surfaces thereof extend in a direction that is substantially parallel to the extending direction of the guide rails 8.

The pulleys 7 are constructed such that the peripheries thereof come into contact with the inwardly facing surfaces of the wall portions 8a while they are rotated. Thus, when the carriers 5 are transferred, the pulleys 7 are rotated while the peripheries thereof are in contact with the inwardly facing surfaces of the wall portions 8a. Accordingly, the carriers 5 are reliably transferred inside the deposition chamber 4 along the guide rails 8 in the above-described transfer direction. In the carriers 5, the substrate holders 5b are fixed to the base 5a at the lower ends thereof, and are linked with the guide rails 8 via the pulleys 7 at positions near the upper ends thereof. Accordingly, by adjusting the diameters of the pulleys 7, the outwardly facing surfaces of the substrate holders 5b can reliably be positioned in the transfer direction and the vertical direction with high accuracy while the carriers 5 are being transferred. More specifically, the film depositing surfaces of the substrates 6, which are fixed to the substrate holders 5b, are also reliably positioned in the vertical direction and the transfer direction with high accuracy.

In addition, a plurality of targets 9 and 10 are disposed on sidewalls 4a and 4b of the deposition chamber 4, and are arranged in the transfer direction. When the substrates 6 are transferred in front of the targets 9 and 10, target particles emitted from erosion regions of the targets 9 and 10 accumulate on the surfaces of the substrates 6, so that thin films are formed.

In addition, first and second thickness distribution correcting members 11 and 12 are disposed in front of the targets 9 and 10, that is, at the sides closer to the substrates 5. In addition, ambient gas injection nozzles 13 for injecting an ambient gas at the centers of the targets 9 and 10 are preferably provided.

The relationship of the first and second thickness distribution correcting members 11 and 12 and the target 9 will be described below with reference to FIGS. 3A and 3B.

Figure 3A:
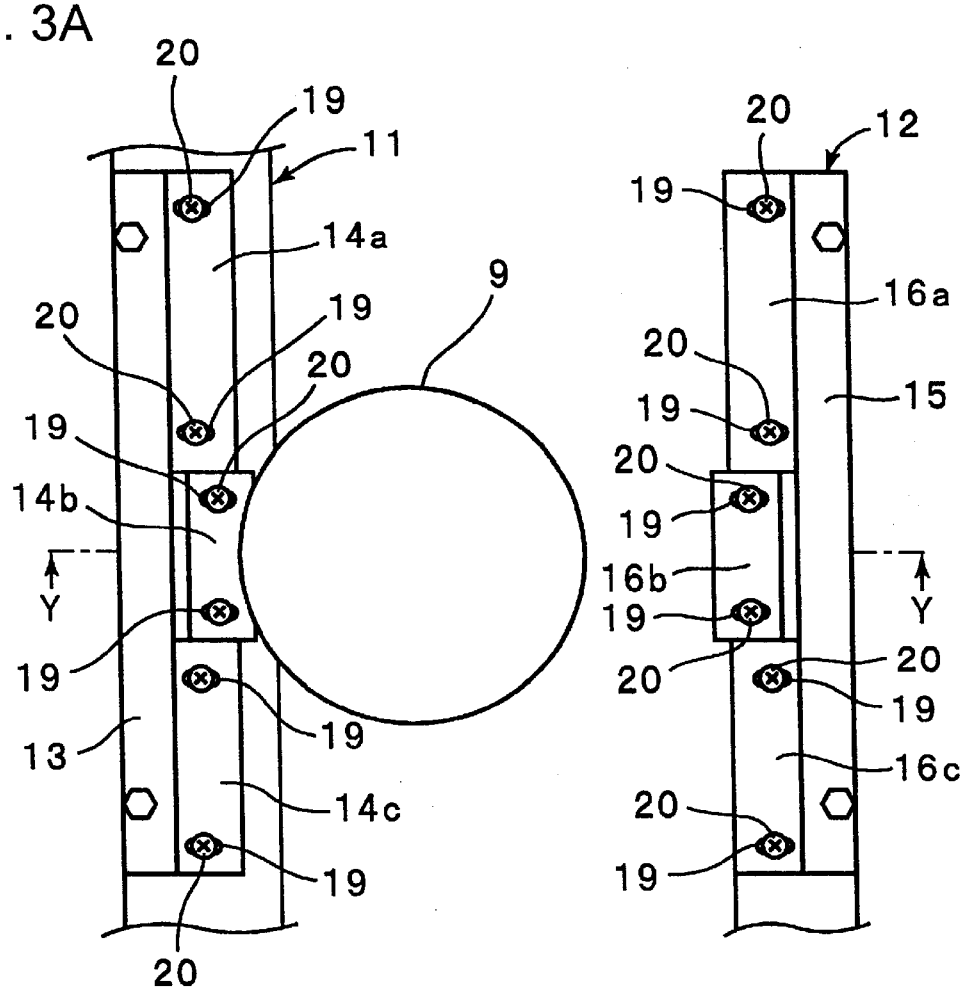

FIG. 3A is a schematic side view of the target 9 and the first and second thickness distribution correcting members 11 and 12 as seen from the direction shown by the arrow X in FIG. 1A. FIG. 3B is a sectional view of FIG. 3A cut along line Y—Y. The substrate 5 is schematically shown in FIG. 3B.

Figure 3B:
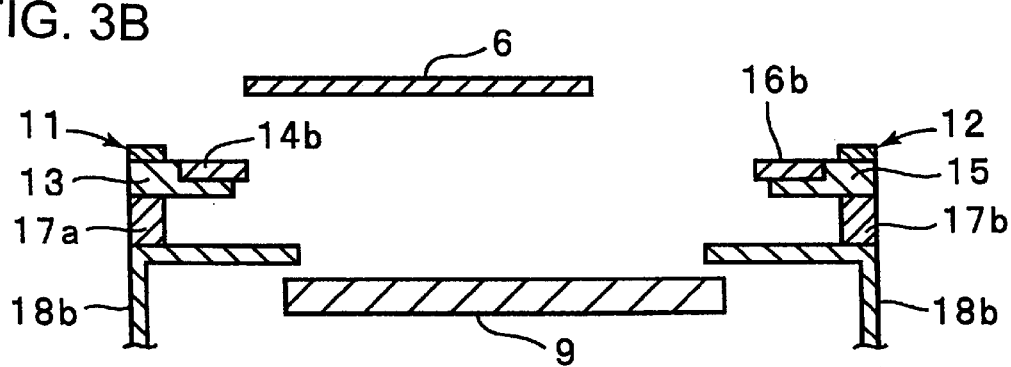

As shown in FIGS. 3A and 3B, the thickness distribution correcting member 11 includes a base plate 13 and moveable plates 14a, 14b and 14c which are moveably linked with the base plate 13. Similarly, the thickness distribution correcting member 12 preferably includes a base plate 15 and moveable plates 16a, 16b and 16c which are moveably linked with the base plate 15. The thickness distribution correcting members 11 and 12 are fixed to shield plates 18a and 18b via struts 17a and 17b, respectively. The target is disposed between the shield plates 18a and 18b.

As shown in FIG. 3A, the thickness distribution correcting members 11 and 12 are provided with three moveable plates 14a, 14b and 14c and three moveable plates 16a, 16b and 16c, respectively, which are arranged vertically. The moveable plates 14a, 14b and 14c and 16a, 16b and 16c are individually provided with long holes 19 which extend in the transfer direction. In addition, the base plates 13 and 15 are provided with tapped holes in the upper surface thereof at positions corresponding to the long holes 19. Bolts 20 are inserted through the long holes 19 formed in the moveable plates 14a, 14b and 14c and 16a, 16b and 16c, and are screwed into the above-described tapped holes formed in the base plates 13 and 15. Accordingly, the moveable plates 14a, 14b, and 14c and 16a, 16b and 16c are attached to the base plates 13 and 15, respectively, in a manner moveable in the extending direction of the long holes 19, by using the bolts 20 and the tapped holes formed in the base plates 13 and 15.

Due to the above-described long holes 19, the moveable plates 14a, 14b and 14c and 16a, 16b and 16c are moveable relative to the base plates 13 and 15 in the extending direction of the long holes, that is, in a direction in which the moveable plates 14a, 14b and 14c and 16a, 16b and 16c move toward and away from the target 9.

In FIG. 3A, the moveable plate 14b of the thickness distribution correcting member 11 which is disposed in the middle is projected toward the target 9 relative to the moveable plates 14a and 14c which are disposed at the ends. Similarly, the moveable plate 16b of the second thickness distribution correcting member 12 which is disposed in the middle is projected toward the target 9.

The present preferred embodiment is characterized in that the moveable plates 14a, 14b and 14c of the first thickness distribution correcting member 11 disposed at one side of the target 9 and the moveable plates 16a, 16b and to 16c of the second thickness distribution correcting member 12 disposed at the other side of the target 9 are constructed such that they are moved symmetrically with respect to a line which passes through the center of the target 9 and is substantially perpendicular to the substrate transferring direction. This construction will be described below with reference to FIGS. 4 and 5.

Figure 4:
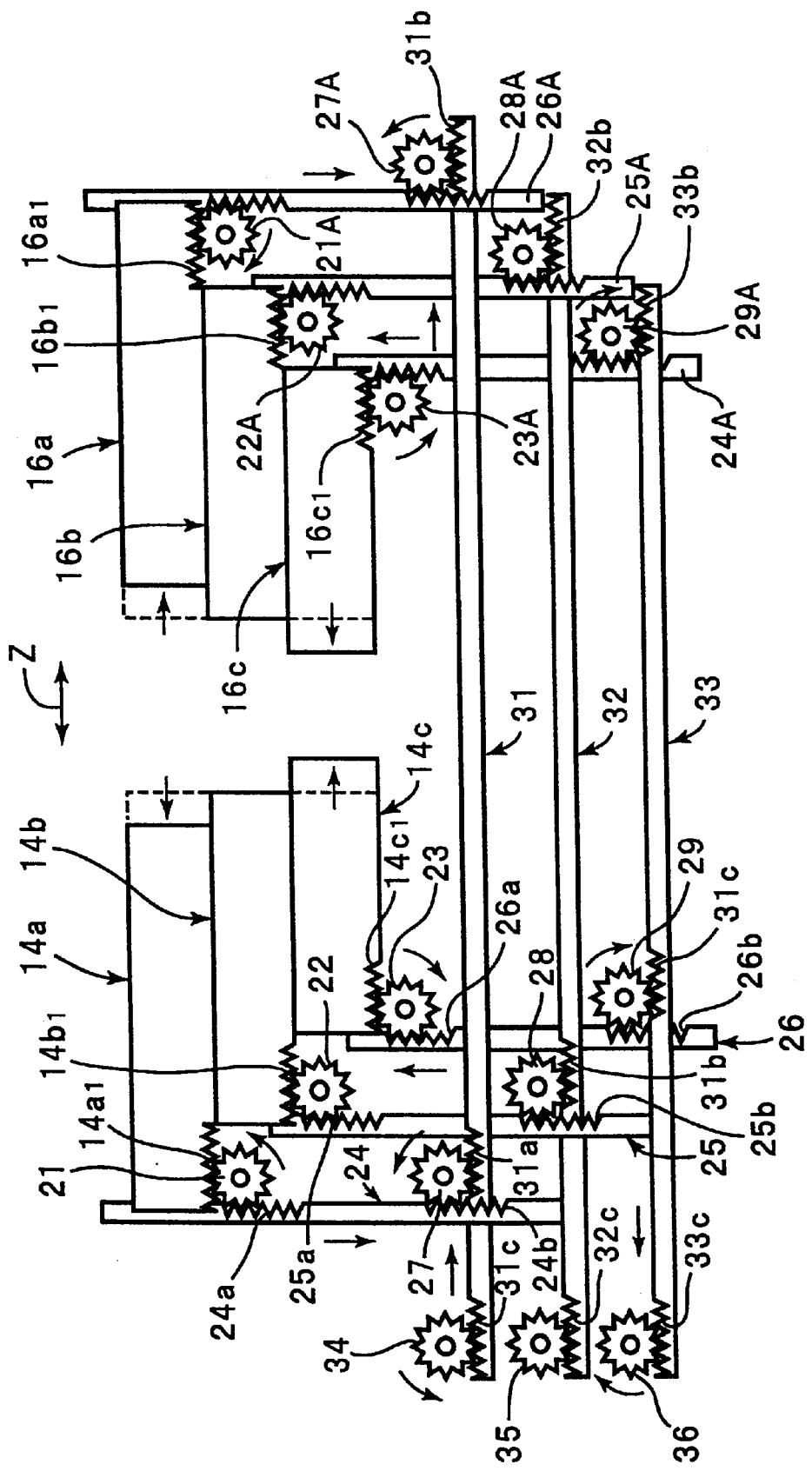
FIG. 4 is a schematic diagram for explaining a linking mechanism used in the sputtering apparatus according to a preferred embodiment of the present invention.

It should be noted that the moveable plates 14a, 14b and 14c and 16a, 16b and 16c are schematically shown in FIG. 4, and are shown by patterns having shapes different from those shown in FIG. 3.

The moveable plates 14a, 14b and 14c are provided with racks $14a_1$, $14b_1$ and $14c_1$ at the outward ends thereof. The racks $14a_1$, $14b_1$ and $14c_1$ are arranged such that the moveable plates 14a, 14b and 14c can be moved in the direction shown by the arrow Z in FIG. 4, that is, in the transfer direction and in the direction reverse thereto. Pinions 21, 22 and 23 are disposed in such a manner that the pinions 21, 22 and 23 are engaged with the racks $14a_1$, $14b_1$ and $14c_1$. In addition, first linking bars 24, 25 and 26 which are provided with racks 24a, 25a and 26a, respectively, and which extend substantially perpendicularly to the above-described arrow Z are disposed such that the racks 24a, 25a and 26a are engaged with the pinions 21, 22 and 23. The linking bars 24, 25 and 26 are also provided with additional racks 24b, 25b and 26b at the other ends relative to the ends at which the racks 24a, 25a and 26a are disposed. In addition, pinions 27, 28 and 29 are disposed in such a manner that the pinions 27, 28 and 29 are engaged with the racks 24b, 25b and 26b.

In addition, second linking bars 31, 32 and 33 which extend in the transfer direction are provided, and racks 31a, 32a and 33a, which are engaged with the pinions 27, 28 and 29, respectively, are disposed in the second linking bars 31, 32 and 33.

The moveable plates 16a, 16b and 16c of the second thickness distribution correcting member 12 are also linked by a linking mechanism similar to that constructed to include racks and pinions as in the first thickness distribution correcting member 11. More specifically, racks $16a_1$, $16b_1$ and $16c_1$ are provided in the moveable plates 16a, 16b and 16c, and pinions 21A, 22A and 23A corresponding to the pinions 21, 22 and 23, respectively, and pinions 27A, 28A and 29A corresponding to the pinions 27, 28 and 29, respectively, are provided. In addition, first linking bars 24A, 25A and 26A corresponding to the first linking bars 24, 25 and 26 are also provided. The second linking bars 31, 32 and 33 are also provided with racks 31b, 32b and 33b, respectively, which are engaged with the pinions 27A, 28A and 29A, respectively.

The second linking bars 31, 32 and 33 are also provided with additional racks 31c, 32c and 33c at the ends thereof, and pinions 34, 35 and 36 which are engaged with the racks 31c, 32c and 33c are provided. The pinions 34, 35 and 36 are individually linked with rotating units such as motors or other suitable devices.

In the construction shown in FIG. 4 that defines a plate driving mechanism, the moveable plates 14a, 14b and 14c and the moveable plates 16a, 16b and 16c can be moved symmetrically by rotating each of the pinions 34, 35 and 36. For example, when the pinion 34 is rotated in a direction shown by the arrow in the figure, the pair of movable plates 14a and 16a are moved in a direction away from the target 9, that is, backward. When the pinion 34 is rotated in the direction reverse to the direction shown by the arrow, the movable plates 14a and 16a are moved closer to each other by the same amount.

In addition, the pair of movable plates 14b and 16b and the pair of movable plates 14c and 16c can also be moved in a similar manner by rotating the pinions 35 and 36, respectively.

Figure 5:
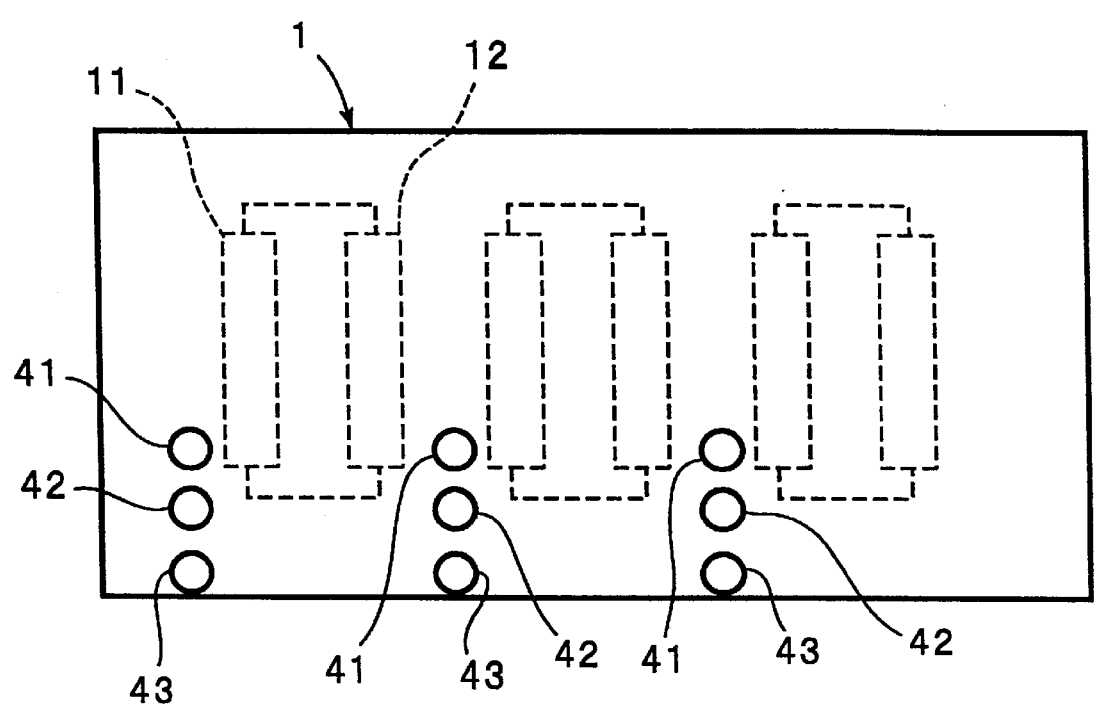
FIG. 5 is a schematic front view of the sputtering apparatus according to a preferred embodiment of the present invention, in which a control unit constructed with switches is provided on the exterior thereof.

The above-described pinions 34, 35 and 36 can be rotated by driving motors that are individually connected thereto. As schematically shown in FIG. 5, in the present preferred embodiment, dial-type switches 41, 42 and 43 for driving the motors are provided on the exterior surface of the sputtering apparatus 1. Each of the switches 41 is used to drive the motor for rotating the pinion 34. In addition, each of the switches 42 is used to drive the motors for rotating the pinion 35, and each of the switches 43 is used to drive the motors for rotating the pinion 36.

Thus, the moveable plates 14a, 14b and 14c and the moveable plates 16a, 16b and 16c can be moved symmetrically by operating the switches 41, 42 and 43.

Accordingly, in the present preferred embodiment, the moveable plates 14a, 14b and 14c and 16a, 16b and 16c of the thickness distribution correcting members 11 and 12 can be moved symmetrically during the deposition process while the low-pressure condition is maintained.

Figure 6:
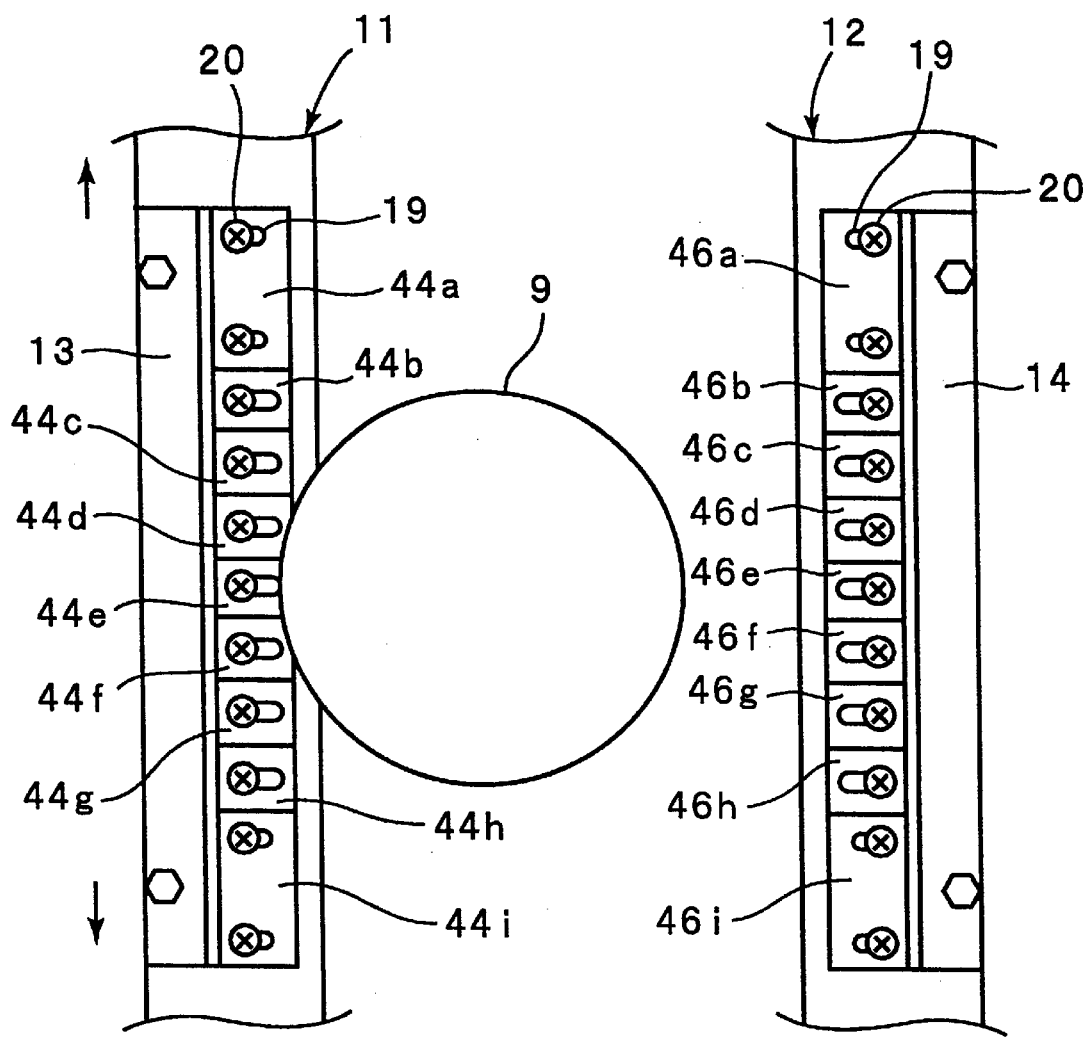
FIG. 6 is a schematic side view of first and second thickness distribution correcting members according to a modification of preferred embodiments of the present invention.

In the example shown in FIGS. 3A and 3B, three moveable plates 14a, 14b and 14c and three moveable plates 16a, 16b and 16c, which are arranged in the vertical direction, are preferably used. However, more than four moveable plates may also be provided when the thickness distribution needs to be corrected more precisely. For example, as shown in FIG. 6, the first and the second thickness distribution correcting members 11 and 12 may each be provided with nine moveable plates 44a to 44i and 46a to 46i. In the modification shown in FIG. 6, the vertical dimension of the moveable plates 44a, 44i, 46a, and 46i, which are disposed at the ends, are different from that of the other moveable plates 44b to 44h and 46b to 46h. Thus, the vertical dimensions, that is, widths, of the moveable plates are not necessarily the same, and vertical dimensions of some of the moveable plates may differ from those of the other moveable plates.

Next, the manner in which the thickness distribution of the thin film is controlled by the sputtering apparatus 1 will be described below with reference to FIGS. 7 to 9.

FIGS. 7 to 9 are schematic diagrams which show thickness distributions of thin films which are formed on substrates using five moveable plates 54a to 54e and five moveable plates 56a to 56e.

Figure 7A:
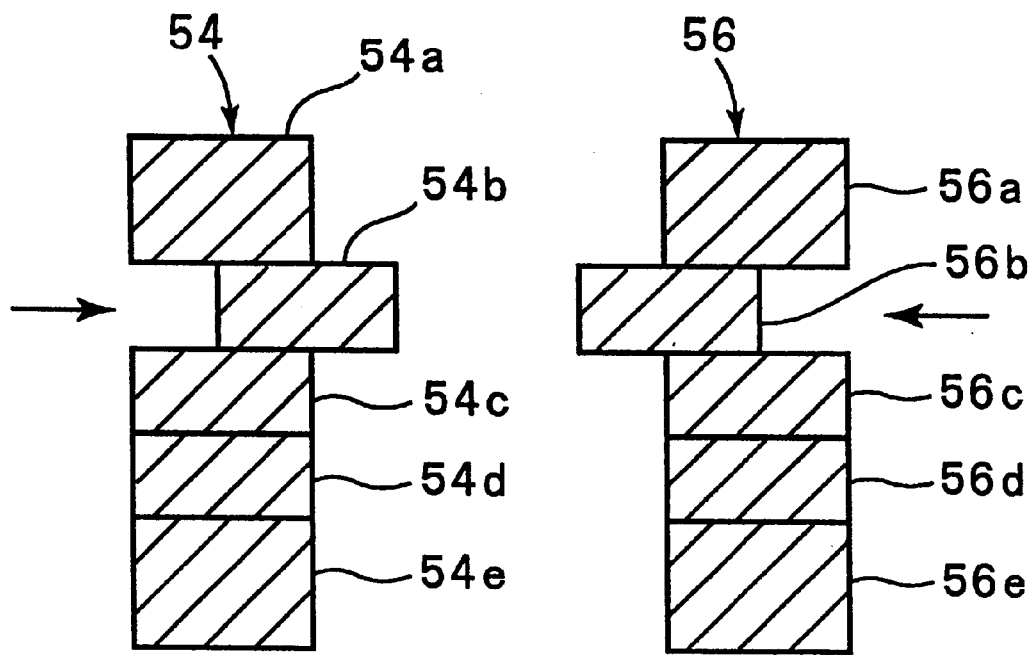
FIG. 7A is a schematic diagram showing a state in which one of five pairs of movable plates is moved.
Figure 7B:
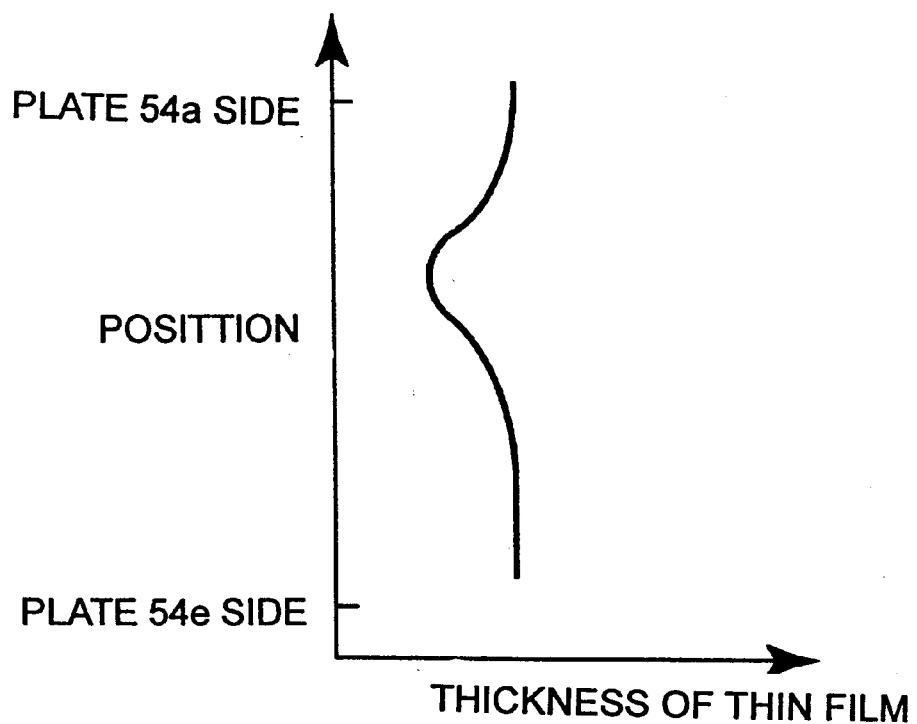
FIG. 7B is a graph showing the relationship between the thickness distribution of a thin film above a target when the moveable plates are in the state shown in FIG. 7A.

In FIG. 7A, in the moveable plates 54a to 54e and 56a to 56e, the moveable plates 54b and 56b that are positioned second from the top are moved so that the gap therebetween is reduced. In this case, as shown in FIG. 7B, the thickness of the thin film is reduced at a portion corresponding to the moveable plates 54b and 56b.

Figure 8A:
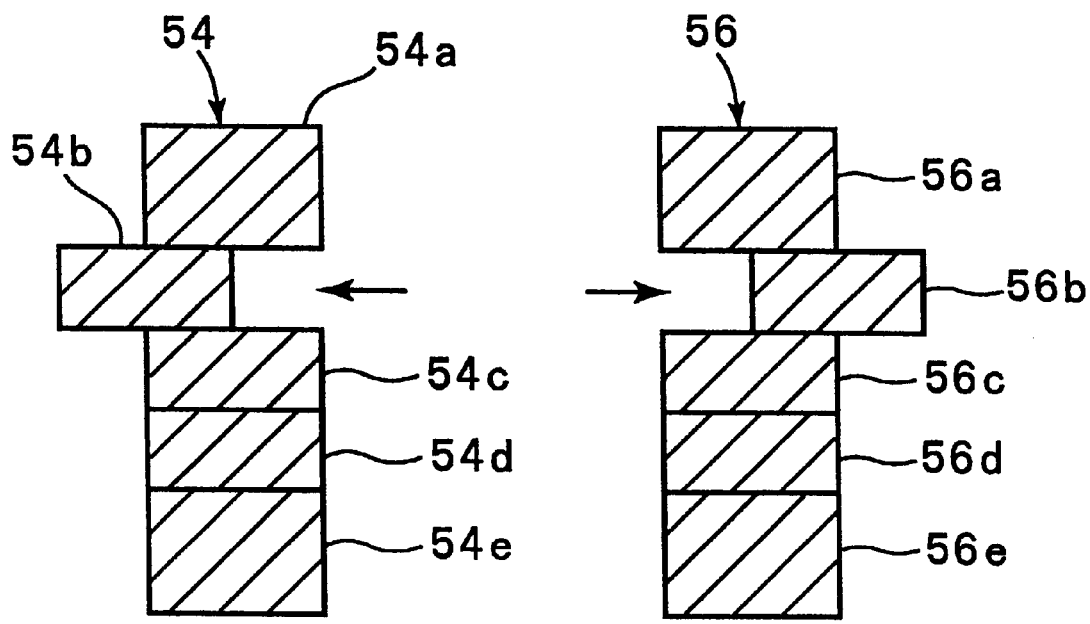
FIG. 8A is a schematic diagram showing a state in which one of five pairs of moveable plates is moved.
Figure 8B:
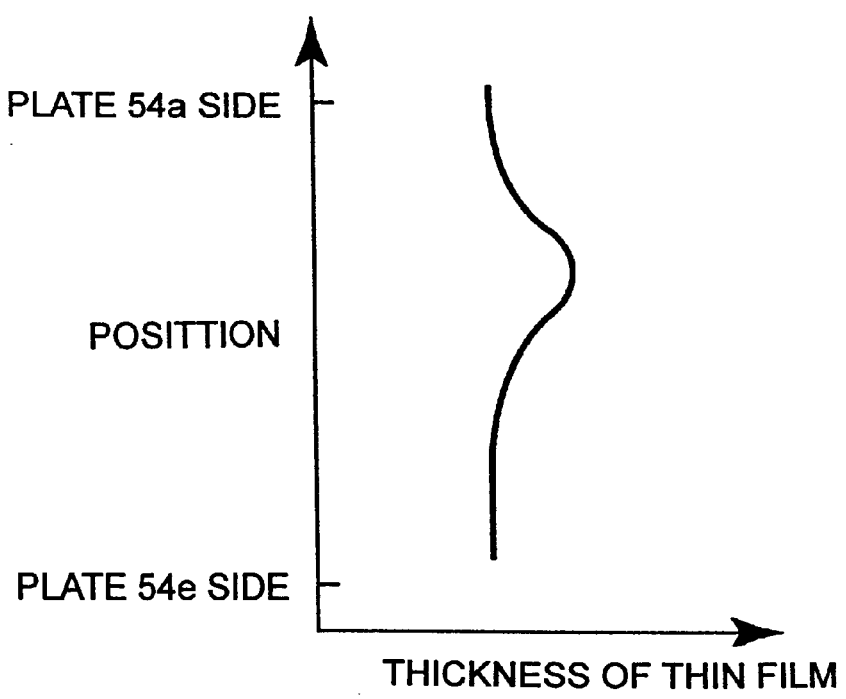
FIG. 8B is a graph showing the relationship between the thickness distribution of the thin film above the target when the moveable plates are in the state shown in FIG. 8A.

In contrast, when the moveable plates 54b and 56b are moved so that the gap therebetween is increased as shown in FIG. 8A, the thickness of the thin film formed on the substrate is increased at a portion corresponding to the moveable plates 54b and 56b as shown in FIG. 8B.

Figure 9A:
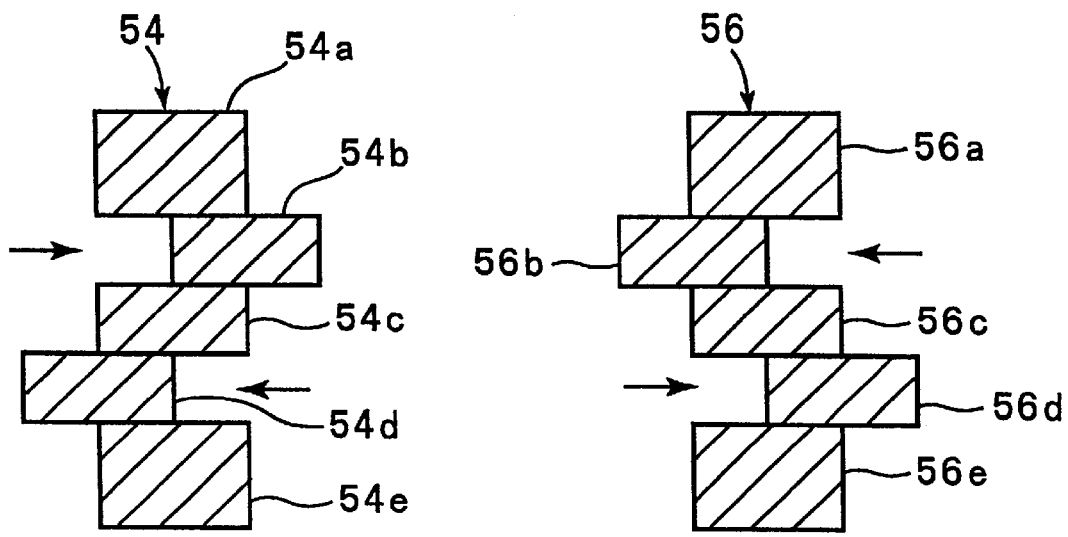
FIG. 9A is a schematic diagram showing a state in which one of five pairs of moveable plates is moved.
Figure 9B:
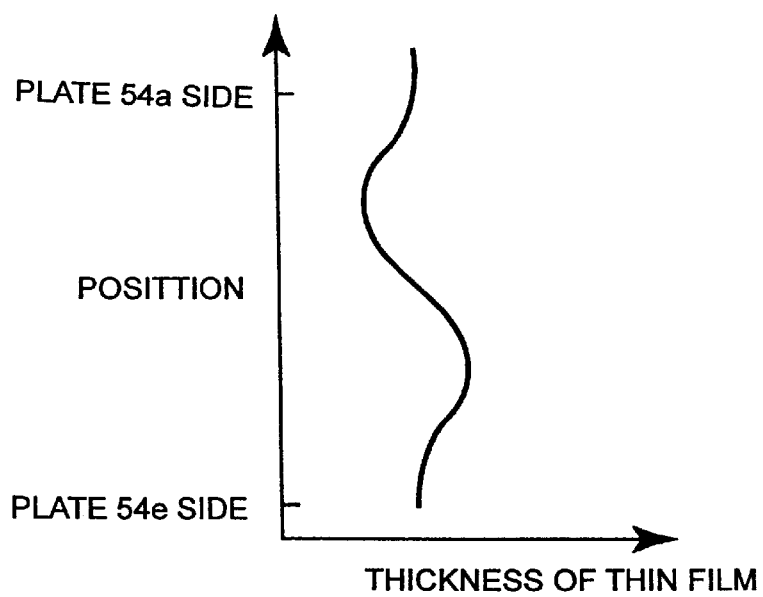
FIG. 9B is a graph showing the relationship between the thickness distribution of the thin film above the target when the moveable plates are in the state shown in FIG. 9A.

Accordingly, it is understood that the thickness of the thin film can easily be adjusted by controlling the gaps between the moveable plates 54a to 54e, and 56a to 56e. For example, the thickness of the thin film formed on the substrate can be varied as shown in FIG. 9B by changing the gaps between the pairs of the moveable plates such as the moveable plates 54a and 56a, etc., variously as shown in FIG. 9A. In other words, the thickness of the thin film formed on the substrate can be adjusted by adjusting the gaps between the moveable plates 54a to 54e and 56a to 56e in accordance with the regional differences thereof. Thus, the thin film having uniform thickness is achieved.

In this case, the moveable plates 54a to 54e and the moveable plates 56a to 56e move in pairs, and every two moveable plates forming a pair are moved symmetrically to each other about the center of the target 9 as described above.

Since all of the pairs of moveable plates are moved symmetrically to each other, the thickness distribution of the thin film is controlled with high accuracy.

In the above-described sputtering apparatus disclosed in Japanese Unexamined Patent Application Publication No. 9-125240, only the gaps between the correction plates are changed. In other words, the correction plates are not moved symmetrically. Accordingly, the thickness distribution cannot be controlled with high accuracy since the relationship between the change of the gap sizes and the change of the thickness distribution cannot be achieved.

In contrast, in the sputtering apparatus of preferred embodiments of the present invention, the moveable plates that oppose each other are symmetrically moved in pairs as described above. Accordingly, when the gaps between the moveable plates are varied, the relationship between the change of the gap sizes and the change of the thickness distribution is achieved. Thus, the thickness distribution is controlled with high accuracy.

Figure 10:
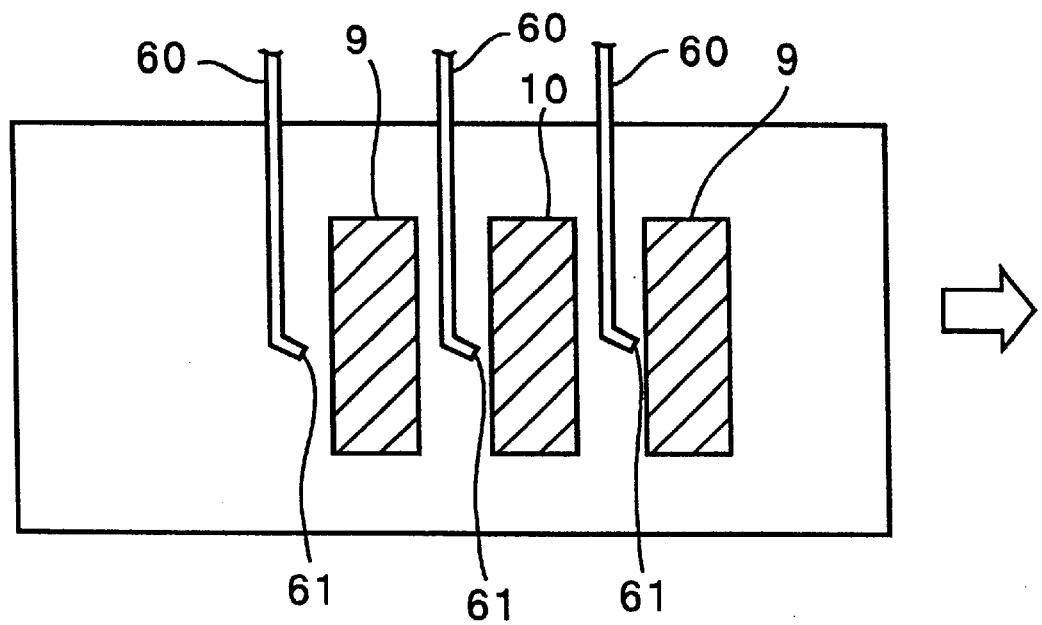
FIG. 10 is a schematic diagram for explaining the relationship between the targets and gas injection pipes.
Figure 11:
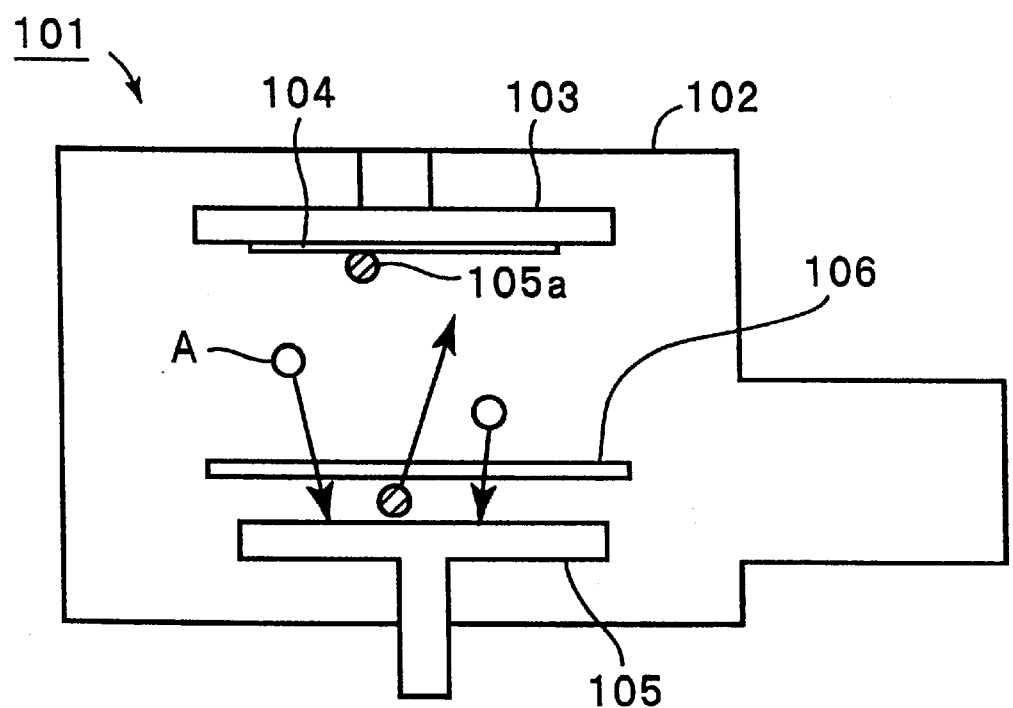
FIG. 11 is a schematic diagram for explaining an example of a conventional sputtering apparatus.
Figure 12:
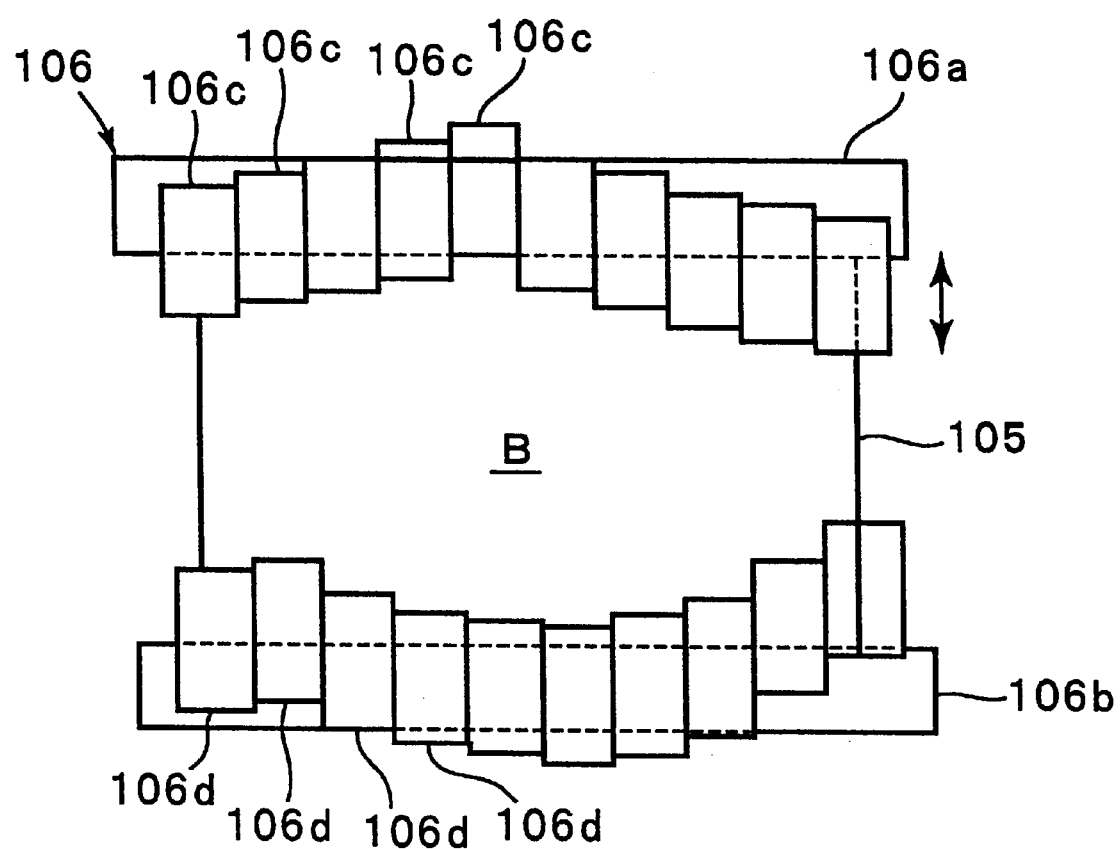
FIG. 12 is a schematic plan view for explaining correcting plates used in the conventional sputtering apparatus for controlling the thickness distribution of a thin film.
Figure 13:
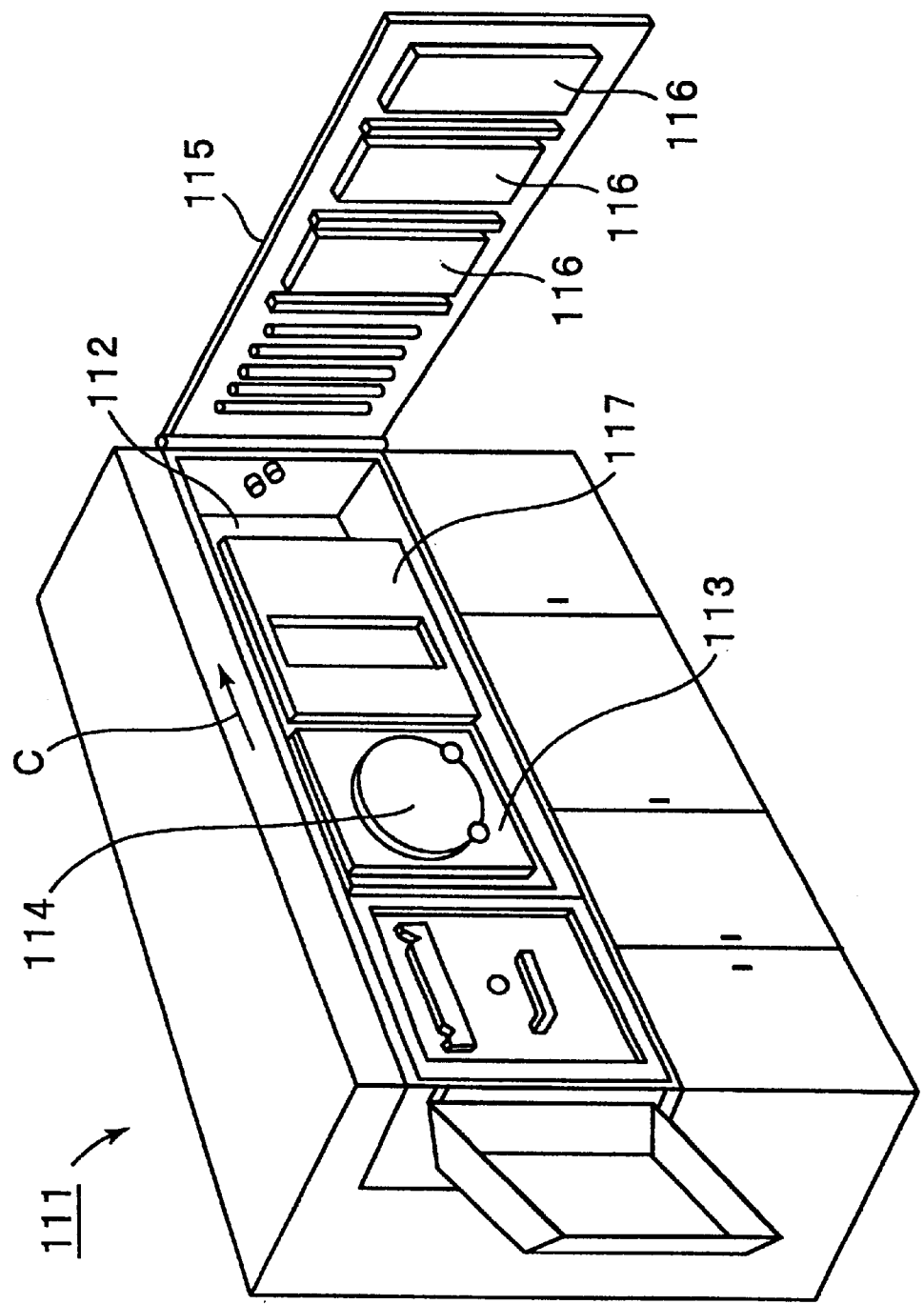
FIG. 13 is a perspective view for explaining another example of a conventional sputtering apparatus.
Figure 14:
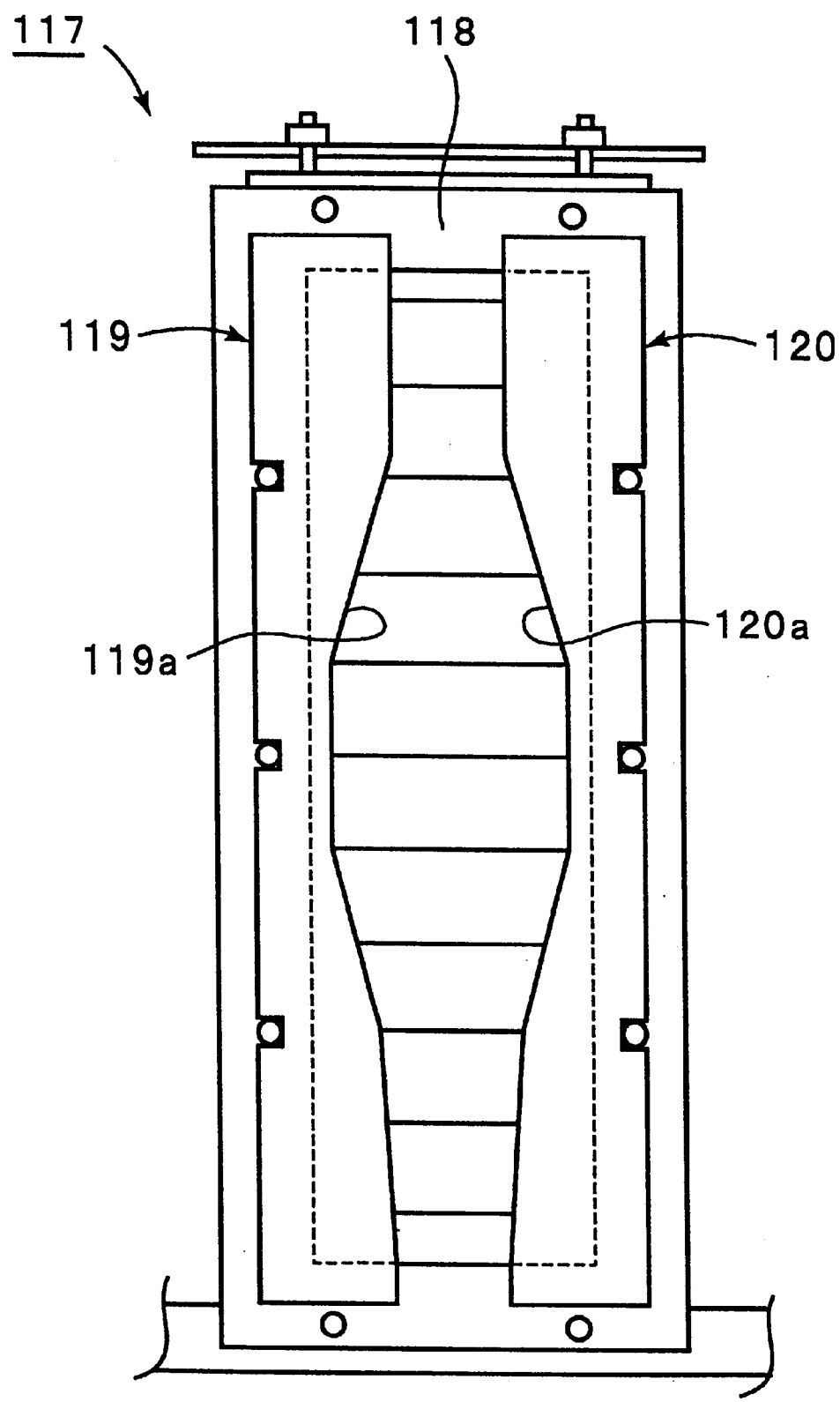
FIG. 14 is a schematic front view for explaining correcting plates used in the sputtering apparatus shown in FIG. 13 for controlling the thickness distribution of a thin film.
Figure 15A:
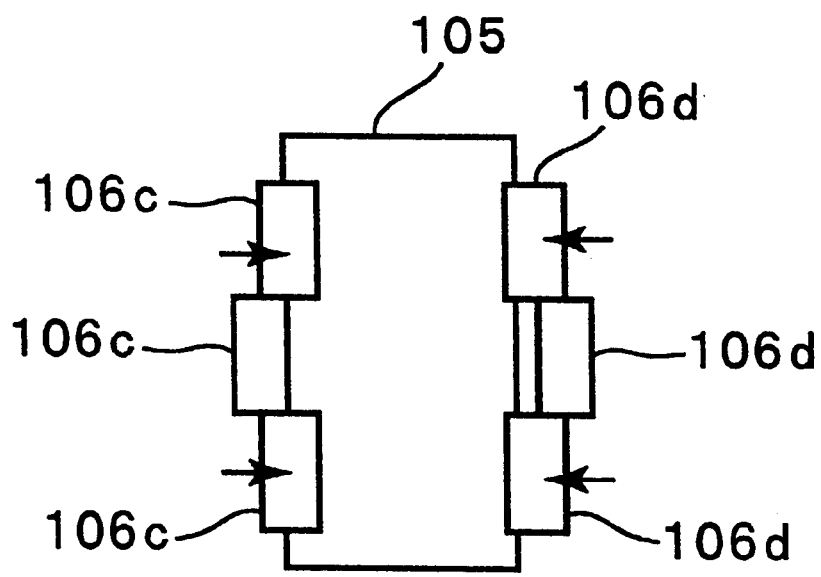
FIGS. 15A and 15B are a schematic plan view and a schematic sectional view, respectively, for explaining an operation of adjusting gaps between the correction plates in the conventional sputtering apparatus shown in FIG. 11.
Figure 15B:
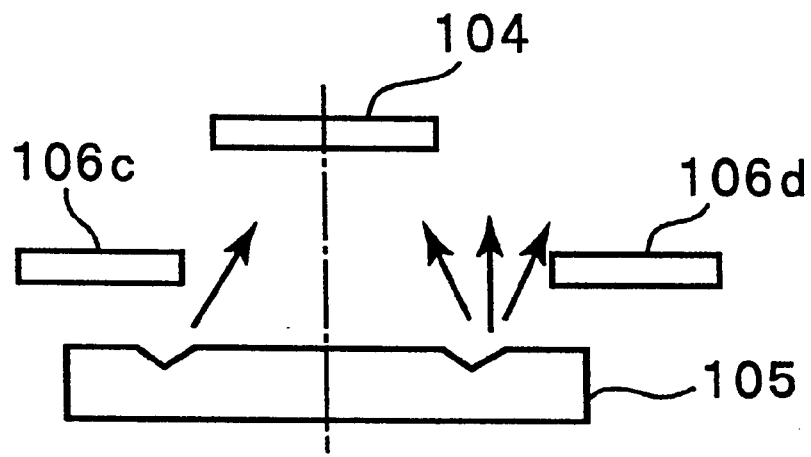

As shown in FIG. 10 by a schematic sectional view, in the sputtering apparatus of the present preferred embodiment, nozzles 61 of ambient gas injection pipes 60 are preferably disposed in such a manner that an ambient gas is ejected at the centers of the targets 9 and 10. The gas uniformly flows over the surfaces of the targets 9 and 10. In addition, since the gas is injected for each of the targets 9 and 10 separately, the amounts of the ambient gas that flow around the targets 9 and 10 are approximately the same. Accordingly, the thickness of the thin film is reliably and accurately adjusted by the thickness distribution correcting members 11 and 12.

Although a separate gas injection pipe is provided for each of the targets in FIG. 1, a plurality of injection pipes may also be provided for each target.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An in-line sputtering apparatus comprising:
   a deposition chamber;
   a target installed inside the deposition chamber;
   a substrate holder to hold a substrate;
   a substrate holder transferring mechanism which transfer the substrate holder relative to the target such that a thin film including a material of the target is formed on the substrate held by the substrate holder;
   first and second thickness distribution correcting members provided above the target, each of the first and second thickness distribution correcting members having a plurality of moveable plates; and a plate driving mechanism linked to the first and second thickness distribution correcting members and symmetrically moving the corresponding moveable plates of the first and second distribution correcting members.

2. An in-line sputtering apparatus according to claim 1, wherein the plate driving mechanism includes a control unit that is disposed outside of the deposition chamber, and a link mechanism having a first end that is linked to the control unit and a second end that is linked to the first and the second thickness distribution correcting members.

3. An in-line sputtering apparatus, according to claim 1, wherein the substrate holder transferring mechanism includes a guide rail that is disposed in the deposition chamber and extends along the transfer direction of the substrate, the substrate holder being constructed to be moveable along the guide rail, and a driving mechanism for driving the substrate holder.

4. An in-line sputtering apparatus according to claim 1, further comprising an ambient gas injection pipe for injecting an ambient gas into the deposition chamber, the ambient gas injection pipe having a plurality of nozzles to eject the ambient gas toward the centers of the target.

5. An in-line sputtering apparatus according to claim 1, wherein the deposition chamber includes a plurality of carriers, each of the carriers includes a base and substrate holders that extend upwardly from the base.

6. An in-line sputtering apparatus according to claim 5, wherein the substrate holders are arranged as pairs, and the substrates are individually fixed on the substrate holders at the outwardly facing surfaces thereof.

7. An in-line sputtering apparatus according to claim 1, further comprising a pair of guide rails extending downwardly from an upper portion of the deposition chamber and a partition plate provided between the pair of guide rails.

8. An in-line sputtering apparatus according to claim 7, wherein end portions of the pair of guide rails are bent toward substrate holders such that upright wall portions of the pair of guide rails are provided at the outward ends of the bent portions.

9. An in-line sputtering apparatus according to claim 8, wherein the upright wall portions are arranged such that the inwardly facing surfaces thereof extend in a direction that is substantially parallel to the extending direction of the pair of guide rails.

10. An in-line sputtering apparatus according to claim 7, wherein the deposition chamber includes a plurality of carriers that are arranged to be movable along the pair of guide rails.

11. An in-line sputtering apparatus according to claim 1, wherein the first thickness distribution correcting member includes a base plate and a plurality of moveable plates which are moveably linked with the base plate.

12. An in-line sputtering apparatus according to claim 11, wherein the plurality of movable plates consists of three movable plates arranged along a vertical direction.

13. An in-line sputtering apparatus according to claim 11, wherein the plurality of movable plates consists of nine movable plates arranged along a vertical direction.

14. An in-line sputtering apparatus according to claim 11, wherein a vertical dimension of at least one of the moveable plates is different from that of the others of the movable plates.

15. An in-line sputtering apparatus according to claim 11, wherein each of the plurality of movable plates includes at least one elongated hole which is arranged to allow the moveable plates to be moveable relative to the base plate.

16. An in-line sputtering apparatus according to claim 1, wherein the second thickness distribution correcting member includes a base plate and a plurality of moveable plates which are moveably linked with the base plate.

17. An in-line sputtering apparatus according to claim 16, wherein the plurality of movable plates consists of three movable plates arranged along a vertical direction.

18. An in-line sputtering apparatus according to claim 16, wherein the plurality of movable plates consists of nine movable plates arranged along a vertical direction.

19. An in-line sputtering apparatus according to claim 16, wherein a vertical dimension of at least one of the moveable plates is different from that of the others of the movable plates.

20. An in-line sputtering apparatus according to claim 16, wherein each of the plurality of movable plates includes at least one elongated hole which is arranged to allow the moveable plates to be moveable relative to the base plate.

21. An in-line sputtering apparatus according to claim 1, further comprising shield plates and struts, wherein the first and second thickness distribution correcting members are fixed to the shield plates via the struts.

22. An in-line sputtering apparatus according to claim 1, wherein the target is disposed between said first and second thickness distribution members.

* * * * *